US008840809B2

(12) United States Patent
Shum et al.

(10) Patent No.: US 8,840,809 B2
(45) Date of Patent: Sep. 23, 2014

(54) SOLUTION-BASED SYNTHESIS OF CSSNI₃ THIN FILMS

(76) Inventors: Kai Shum, Orefield, PA (US); Zhuo Chen, Brooklyn, NY (US); Yuhang Ren, Secaucus, NJ (US)

( * ) Notice: Subject to any disclaimer, the term of this patent is extended or adjusted under 35 U.S.C. 154(b) by 95 days.

(21) Appl. No.: 13/491,564

(22) Filed: Jun. 7, 2012

(65) Prior Publication Data

US 2013/0139872 A1 Jun. 6, 2013

Related U.S. Application Data

(63) Continuation-in-part of application No. 13/151,243, filed on Jun. 1, 2011, now Pat. No. 8,529,797.

(51) Int. Cl.
| *C09K 11/02* | (2006.01) |
| *C09K 11/08* | (2006.01) |
| *C09K 11/77* | (2006.01) |
| *H01L 31/18* | (2006.01) |
| *H01L 31/032* | (2006.01) |
| *H01L 21/02* | (2006.01) |
| *H01L 33/00* | (2010.01) |
| *H01L 33/26* | (2010.01) |

(52) U.S. Cl.
CPC ............... *H01L 31/18* (2013.01); *H01L 33/005* (2013.01); *H01L 31/032* (2013.01); *H01L 21/02521* (2013.01); *H01L 33/26* (2013.01); *H01L 21/02628* (2013.01)
USPC .................................................. 252/301.4 R

(58) Field of Classification Search
CPC . A61K 2300/00; A61K 9/1617; A61K 33/06; A61K 33/14; A61K 9/1623
USPC .................. 252/501.1, 520.1, 521.5, 301.4 R
See application file for complete search history.

(56) References Cited

U.S. PATENT DOCUMENTS

| 2,576,952 | A | * | 12/1951 | Lowe et al. | 118/24 |
| 5,871,579 | A | * | 2/1999 | Liang et al. | 117/68 |
| 8,529,797 | B2 | * | 9/2013 | Shum | 252/501.1 |
| 2008/0014463 | A1 | * | 1/2008 | Varadarajan et al. | 428/690 |
| 2010/0331428 | A1 | * | 12/2010 | Truong-Le et al. | 514/777 |
| 2011/0180757 | A1 | * | 7/2011 | Vockic et al. | 252/301.4 F |

OTHER PUBLICATIONS

Zaharchenko et al., "Laser-Induced Luminescence of CdSe/ZnS Nanoparticles in Solution and Condensed Phase," Laser Physics, vol. 15, No. 8, 2005, pp. 1150-1153.*

* cited by examiner

*Primary Examiner* — Mark Kopec
*Assistant Examiner* — William Young

(57) ABSTRACT

This invention discloses a solution-based synthesis of cesium tin tri-iodide ($CsSnI_3$) film. More specifically, the invention is directed to a solution-based spray-coating synthesis of cesium tin tri-iodide ($CsSnI_3$) thin films. This invention is also directed to effective and inexpensive methods to synthesize the thin $CsSnI_3$ films on large-area substrates such as glass, ceramics, glass, ceramic, silicon, and metal foils. $CsSnI_3$ films are ideally suited for a wide range of applications such as light emitting and photovoltaic devices.

13 Claims, 7 Drawing Sheets

SOLUTION-BASED SYNTHESIS OF CSSNI$_3$ THIN FILMS

CROSS-REFERENCE TO RELATED APPLICATIONS

This invention is a continuation-in-part of U.S. non-provisional application Ser. No. 13,151,243, filed Jun. 1, 2011, entitled: "PEROVSKITE SEMICONDUCTOR THIN FILM AND METHOD OF MAKING THEREOF". The disclosure of this non-provisional application is hereby incorporated by reference.

BACKGROUND OF THE INVENTION

The current thin-film photovoltaic technologies can be classified by the different materials used for the light absorption in a solar cell. These materials include amorphous and polycrystalline silicon, CdTe, CuIn$_x$Ga$_{1-x}$Se$_2$(CIGS), GaAs, and photosensitive organic dyes. A transformative technology may emerge when a new and better material is being discovered for thin-film photovoltaic applications.

D. Scaife, P. Weller, and W. Fisher, reported an early study on the structural information of CsSnI$_3$ compound in form of powders, J. Solid State Chem. 9, 308 (1974).

P. Mauersberger and F. Huber, synthesized a yellow, needle-like CsSnI$_3$ microcrystal, and studied its crystal structure, Acta Cryst. B 36, 683 (1980).

K. Yamada, S. Funabiki, H. Horimoto, T. Matsui, T. Okuda, and S. Ichiba, reported the polymorph nature of CsSnI$_3$ compound, Chem. Lett. (The Chemical Society of Japan) 20, 801 (1991).

The black polymorph of CsSnI$_3$ could be obtained through a phase transition from the yellow polymorph CsSnI$_3$ by increasing its temperature above 425° K. It was further demonstrated by differential thermal analysis and X-ray diffraction that during the cooling of the black CsSnI$_3$ from 450° K, its ideal cubic perovskite structure (B-α) deformed to a tetragonal structure (B-β) at 426° K, and became an orthorhombic structure (B-γ) below 351° K. Experimental studies of electrical and optical properties of this compound have been hindered by lack of high quality CsSn$_{I3}$ samples either in bulk or thin film format.

Aiming at the unique properties of hybrid organic-inorganic perovskites based on tin halides, I. Borriello, G. Gantel, and D. Ninno, recently calculated band structures of B-α, B-β, and B-γ from the first principles using the crystal structures published by Yamada et al., Phys. Rev. B 77, 235214 (2008). It was concluded that all three structures had direct band-gap (E$_g$) at Z, R, and Γ points for B-α, B-β, and B-γ, respectively, with E$_g$(B-α)<E$_g$(B-β)<E$_g$(B-γ).

A need still exists in the industry for developing low cost synthesis methods for CsSnI$_3$ thin films, especially in large scale. The successful implementation of these materials for various applications requires a detailed understanding of both their processing and materials properties.

BRIEF SUMMARY OF THE INVENTION

This invention is directed to solution-based synthesis of cesium tin tri-iodide (CsSnI$_3$) films. This invention is also directed to effective and inexpensive methods to synthesize the films on large-area substrates such as glass, ceramics, and metal foils.

One embodiment of this invention is directed to a process of forming CsSnI$_3$ film on a substrate, comprising steps of:
 (a) providing a substrate;
 (b) provide CsI solution;
 (c) provide SnCl$_2$ solution;
 (d) spray-coating the CsI solution onto the substrate;
 (e) spray-coating the SnCl$_2$ solution onto the substrate;
 (f) heat treating the substrate after steps (d) and (e); and
 (g) forming the CsSnI$_3$ film on the substrate.

Another embodiment of this invention is directed to a process of forming CsSnI$_3$ film on a substrate, comprising steps of:
 (a) providing a substrate;
 (b) provide about 5 wt % to about 50 wt % CsI solution by fully dissolving CsI powder (99.9% purity) in a solvent;
 (c) provide about 5 wt % to about 80 wt % SnCl$_2$ solution by fully dissolving SnCl$_2$ powder (99.9% purity) in a solvent;
 (d) spray-coating the CsI solution onto the substrate;
 (e) spray-coating the SnCl$_2$ solution onto the substrate;
 (f) repeating steps (d) and (e);
 (g) heat treating the substrate after steps (d) to (f); and
 (h) forming the CsSnI$_3$ film on the substrate.

Yet, another embodiment of this invention is directed to CsSnI$_3$ films synthesized on a substrate by any one of the processes disclosed above.

In the process, the steps are performed under ambient condition except the heat treating step is performed under a temperature ranging from about 150° C. to about 250° C.

The substrate is selected from glass, ceramic, silicon, and metal foils.

The CsI solution is made by fully dissolving CsI powder (99.9% purity) in a solvent selected from the group consisting of water, deionized water, distilled water and mixtures thereof. The CsI solution is about 5 wt % to about 50 wt % CsI solution.

The SnCl$_2$ solution is made by fully dissolving SnCl$_2$ powder (99.9% purity) in a solvent selected from the group consisting of anhydrous alcohol, glacial acetic acid; ethylene glycol or triethylene glycol; and mixtures thereof. The SnCl$_2$ solution is about 5 wt % to about 80 wt % SnCl$_2$ solution.

DETAILED DESCRIPTION OF THE INVENTION

U.S. patent application Ser. No. 13,151,243 discloses the vacuum-powder-based synthesis and characterization of $CsSnI_3$ thin films. The precursor materials (powder) of CsI and $SnCl_2$ (or $SnI_2$) were alternately evaporated in a vacuum chamber on a substrate. The resulting $CsSnI_3$ thin-film was formed after a post-deposition thermal treatment. The $CsSnI_3$ thin films exhibit outstanding optical, electrical, and ferroelectric properties. These features make $CsSnI_3$ thin films ideally suited for a wide range of applications such as light emitting and photovoltaic devices.

More specifically, U.S. patent application Ser. No. 13,151,243 discloses that $CsSnI_3$ is a promising material in the application of thin-film solar cells, since $CsSnI_3$ was found to possess a direct band gap of 1.32 eV at room temperature, right in the narrow region of optimal band gaps for the Shockley-Queisser maximum efficiency limit of a solar cell.

An effective and inexpensive method to synthesize high quality perovskite semiconductor thin films on large-area substrates such as glass, ceramics, silicon, and metal foils is disclosed in the present invention.

A non-vacuum, solution-based method to synthesize $CsSnI_3$ is disclosed in the present invention.

More specifically, the synthesis or deposition method is based on ultrasonic spray deposition of aqueous-based precursor solutions, which represents a significant cost savings compared to vacuum deposition methods. It's believed that a simple spray-coating deposition method, which can be performed using aqueous-based liquid precursor materials in air, is a candidate for an even more cost-effective and widely implementable production method for large-scale device applications.

The films can be fabricated on inexpensive substrates such as glass, ceramics, silicon, and metal foils by the solution-based spray-coating. This non-vacuum-powder based demonstration of the $CsSnI_3$ thin film formation further enhances the likelihood of using $CsSnI_3$ as a new absorption material for solar cells.

WORKING EXAMPLES

The procedures of synthesizing polycrystalline $CsSnI_3$ thin film using solutions were described.

Figure 1:
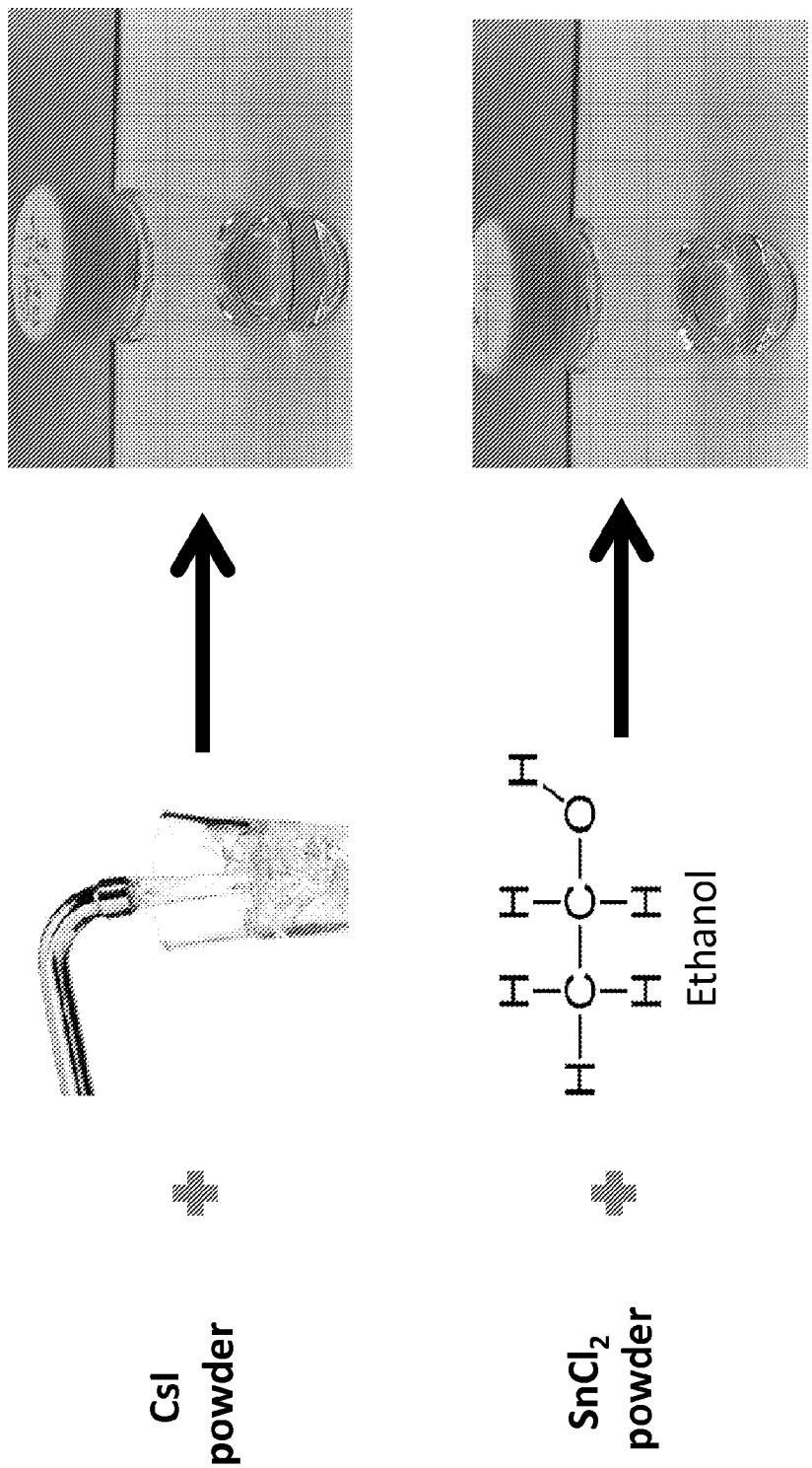
FIG. 1 shows the experimental setup for forming CsI and SnCl$_2$ solutions.

The solutions of precursor materials were synthesized in ambient conditions. The ambient conditions refer to: room temperature or temperature of 298.15° K (or 25° C., 77° F.); and an absolute pressure of 100 kPa (or 14.504 psi, 0.986 atm). The experimental setup was shown in FIG. 1.

Sono-Tek ultrasonic spraying system from Sono-Tek Corporation was used to spray the solutions in Example 3. Ultrasonic atomizers produce extremely fine atomized liquid through a two-step process.

Step 1: Liquid is injected through a number of small orifices into the nozzle outlet channel, where a high velocity air stream provides the first liquid breakup.

Step 2: The air stream carrying the droplets impacts onto a resonator placed in front of the nozzle outlet orifice, generating a field of high frequency sound waves. Flying through the sound wave field, the droplets undergo an additional breakup step.

The Sono-Tek ultrasonic spraying system incorporated an ultrasonic atomizing nozzle, vibrating at a frequency of 120 kHz created by a piezoelectric transducer inside the titanium nozzle housing. The substrate holding platform was capable of heating substrates up to 250° C.

Ultrasonic atomizers offer the following distinct advantages:
1) No wet spots—the water will evaporate before touching the ground or surface.
2) The high variations in local air pressure induced by the sound waves prevent dust and lime particles from building.
3) Since liquid and compressed air are ejected from different orifices, their pressure values can be adjusted separately, this allows for obtaining satisfactory operating conditions to maximize the thin film quality.

EXAMPLE 1

Synthesis of CsI Solution 12 gram of CsI powder (99.9% purity) was added to 30 gram of deionized water to form 28.6 wt % (weight percent) CsI solution. The CsI powder was fully dissolved in deionized water. The CsI solution was stirred for 30 minutes.

CsI solution was colorless and stable in ambient conditions.

The CsI solution could comprise more CsI powder as long as the amount of CsI powder was fully dissolved in deionized water, and the CsI solution was colorless. CsI powder could dissolve in less than its own mass of water without apparent decomposition.

It would be apparent to one skilled in the art that CsI solutions could be made using any solvents other than those used in the examples. Examples of the solvent include but not limited to, water, distilled water, mixtures thereof.

The wt % range of the CsI solution was ranging from about 5.0 wt % to about 50.0 wt %, or from about 15 wt % to about 40 wt %.

EXAMPLE 2

Synthesis of $SnCl_2$ Solution

An amount of 4 gram of $SnCl_2$ powder (99.9% purity) was added to 20 gram of anhydrous ethanol to form 16.7 wt % of solution. The $SnCl_2$ powder was fully dissolved in anhydrous ethanol to form the $SnCl_2$ solution. The solution was stirred for 30 minutes.

$SnCl_2$ solution was colorless and stable in ambient conditions.

The $SnCl_2$ solution could comprise more $SnCl_2$ powder as long as the amount of $SnCl_2$ powder was fully dissolved in anhydrous ethanol, and the solution was colorless.

It would be apparent to one skilled in the art that $SnCl_2$ solutions could be made using any solvents other than those used in the examples. Examples of the solvent include but not limited to, anhydrous alcohol, such as but not limited to, anhydrous methanol and anhydrous isopropyl; glacial acetic acid; ethylene glycol or triethylene glycol; and the mixtures thereof.

The wt % range of the $SnCl_2$ solution was ranging from about 20 wt % to about 80%, or from about 10 wt % to about 50 wt %.

EXAMPLE 3

Synthesis of $CsSnI_3$ Film by Spray-coating

To synthesize $CsSnI_3$ thin-films for large-scale device applications, the solutions of CsI and $SnCl_2$ prepared above were used. Sono-Tek ultrasonic spraying system from Sono-Tek Corporation was used to spray the solutions.

Figure 2:
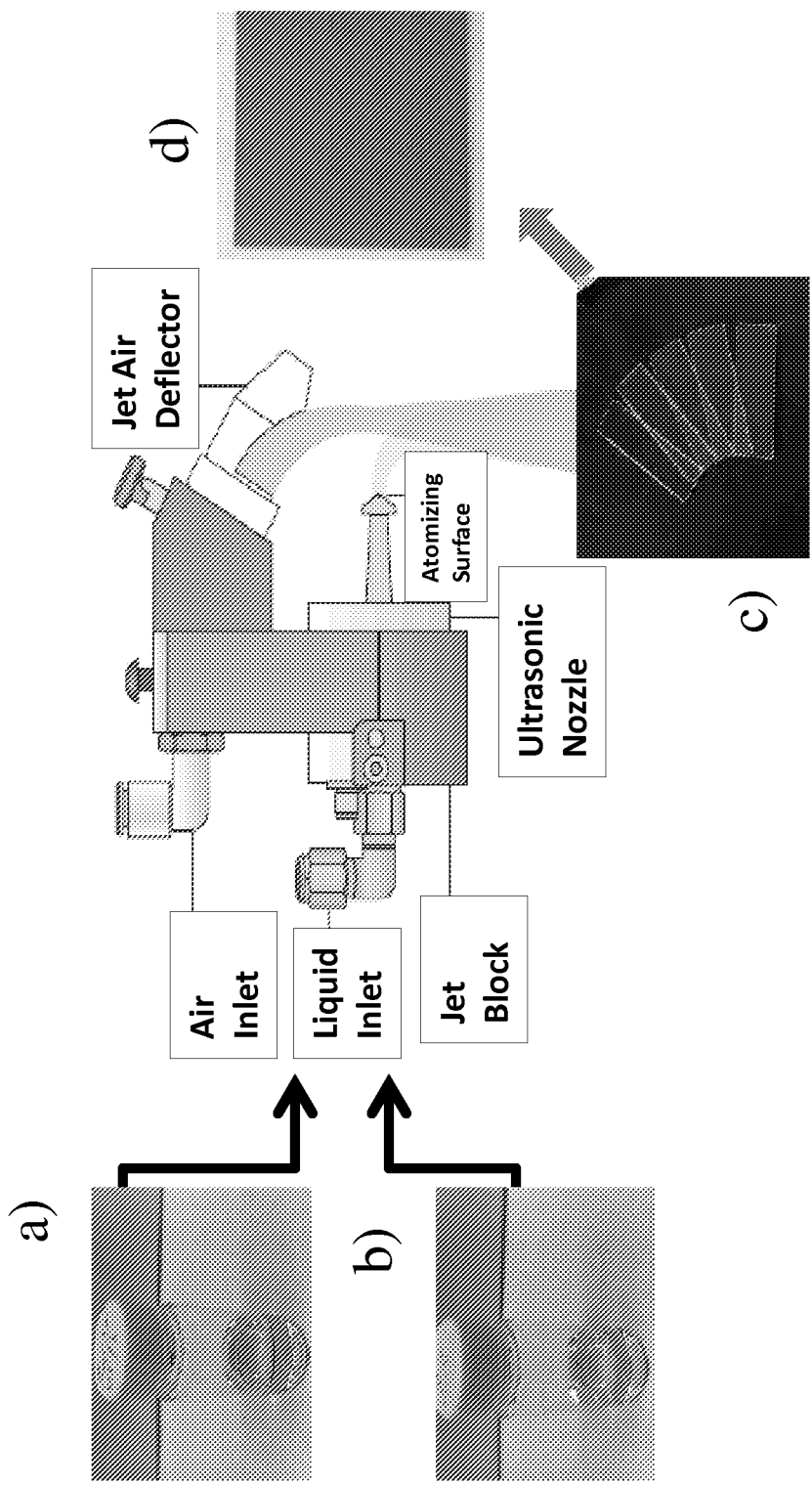
FIG. 2 shows the spay-coating apparatus for alternately spraying CsI solution (a) and SnCl$_2$ solution (b) on a substrate (c) to form multi-layers of CsI and SnCl$_2$.

The spraying apparatus was shown in FIG. 2. The apparatus also showed how CsI solution (a) and $SnCl_2$ solution (b), were alternately sprayed on the substrate (c) to form multi-layers of CsI and SnCl$_2$. The desired film thicknesses could be controlled by repeating the alternating spraying of two solutions as many time as needed.

The SnCl$_2$ solution was sprayed first for 10 seconds and immediately followed with the spray of the CsI solution with a same spray speed as for the SnCl$_2$ solution for another 10 seconds.

Various spray speed (or solution flow rate) from about 0.03 to about 0.8 mL/min for both solutions were experimented resulting in a range of film thickness from sub-micrometer to a few μm. A proper spray speed was necessary to insure film uniformity.

A post-spray heat treatment, or thermal annealing, with temperature ranging from about 150° C. to about 250° C. was applied to form uniform CsSnI$_3$ thin-films. In this Example, both glass and ceramic substrates were used.

A solution-based spray-coated thin-film was formed on a ceramic substrate and a glass substrate with a spray speed of 0.4 mL/min for both CsI and SnCl$_2$ solutions. The post-spray heat treatment was done by heat-treating the substrates at 200° C. for one minute.

Figure 3:
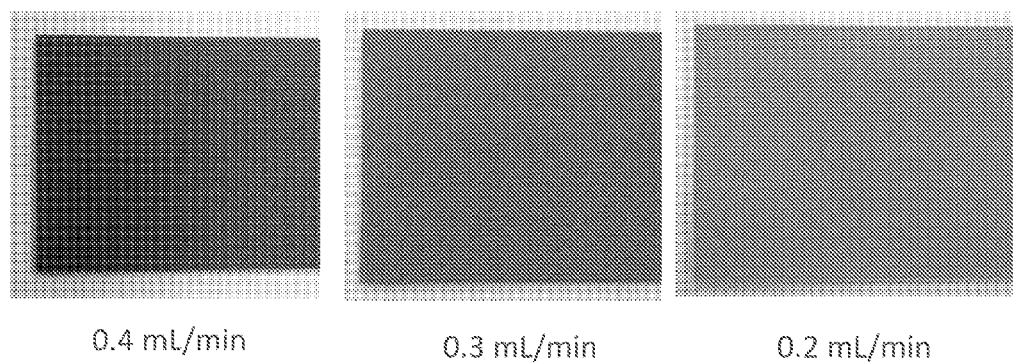
FIG. 3 shows solution-based spray-coated CsSnI$_3$ films prepared at different flow (spray) rates.

The solution-based spray-coated CsSnI$_3$ films prepared at different flow rates were shown in FIG. 3. As indicated in FIG. 3, the color of the films changed from darker to lighter as the flow rates changed from 0.4 mL/min, to 0.3 mL/min, and to 0.2 mL/min. The darker color indicated thicker film.

Figure 4:
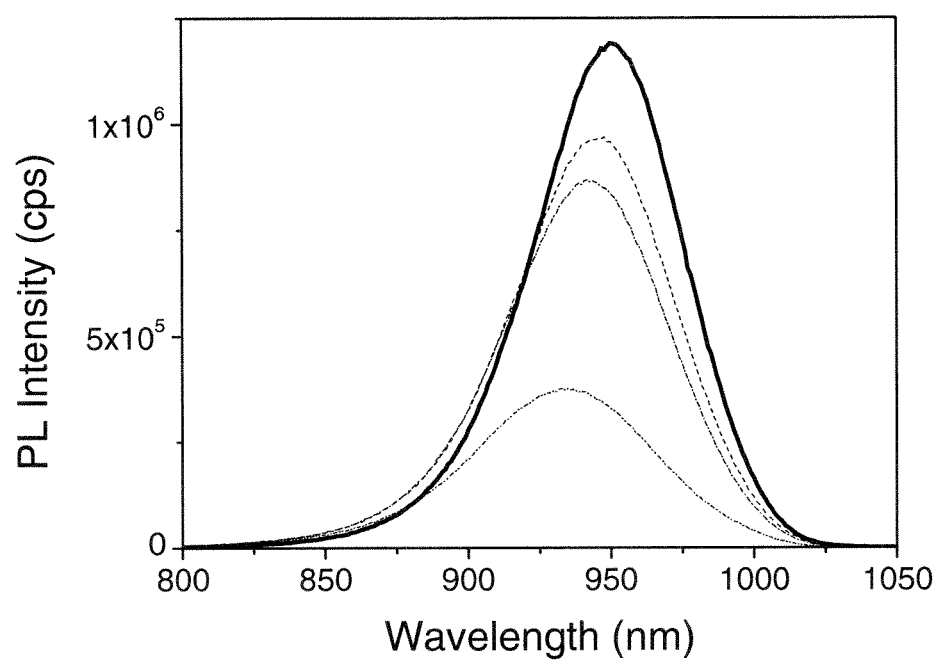
FIG. 4 shows photoluminescence (PL) characterization of solution-based spray-coated CsSnI$_3$ thin films formed at different flow (spray) rates.

Photoluminescence characterization of solution-based spray-coated CsSnI$_3$ thin-films on glass substrate prepared at different flow rates were shown in FIG. 4. From top down, the flow rates were 0.4 mL/min, 0.3 mL/min, 0.2 mL/min, and 0.1 mL/min.

Figure 5:
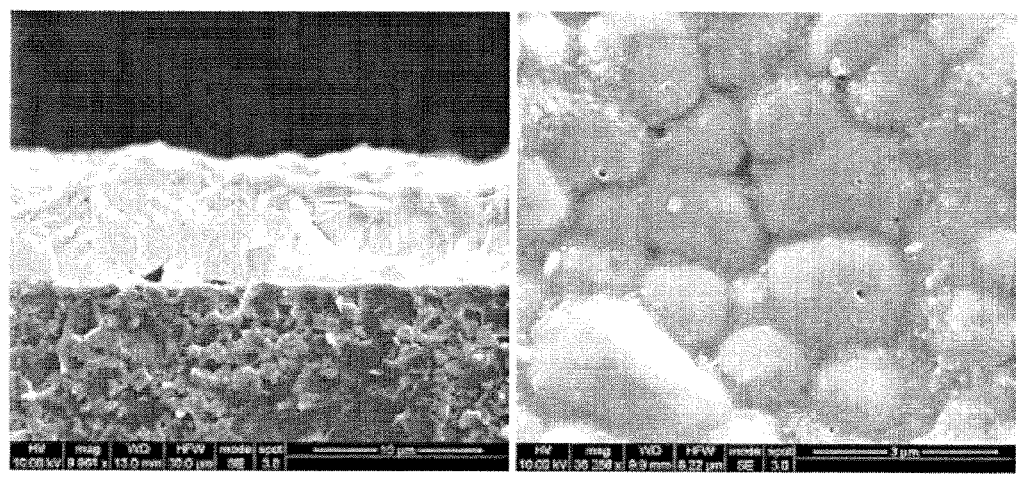
FIG. 5 shows the cross-sectional scanning electron micrographic (SEM) image (left) and surface SEM image (right) of a typical CsSnI$_3$ thin film formed by ultrasonic solution-based spray-coating.

The cross-sectional SEM image of the solution-based spray-coated CsSnI$_3$ film was shown in FIG. 5. Inspecting the SEM image, the film was about 5 μm thick and contained polycrystalline domains with a typical domain size of ~2 μm (viewed from surface SEM images).

The chemical reaction for the mixture of the solutions could be described as the following:

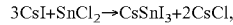

$$3CsI+SnCl_2 \rightarrow CsSnI_3+2CsCl,$$

The reaction was verified by identifying the end products of CsSnI$_3$ and CsCl using the X-ray diffraction (XRD) data to be discussed later.

Photoluminescence (PL) data and X-ray diffraction data (XRD) were used to identify solution-based spray-coated CsSnI$_3$ and to characterize the crystalline quality of each individual domain.

PL spectra were taken from a Nanolog system from Horiba Jobin Yvon. The Nanolog system had a 450 W Xe-lamp light source, a double-grating excitation spectrometer to select a central excitation wavelength and its bandwidth, a sample compartment, and an emission spectrometer to spectrally select desired emission to a photomultiplier tube (Hamamatsu P2658P) coupled with single photon-counting electronic circuits.

A relative low photoexcitation level of ~20 mW cm$^{-2}$ was used.

Figure 6:
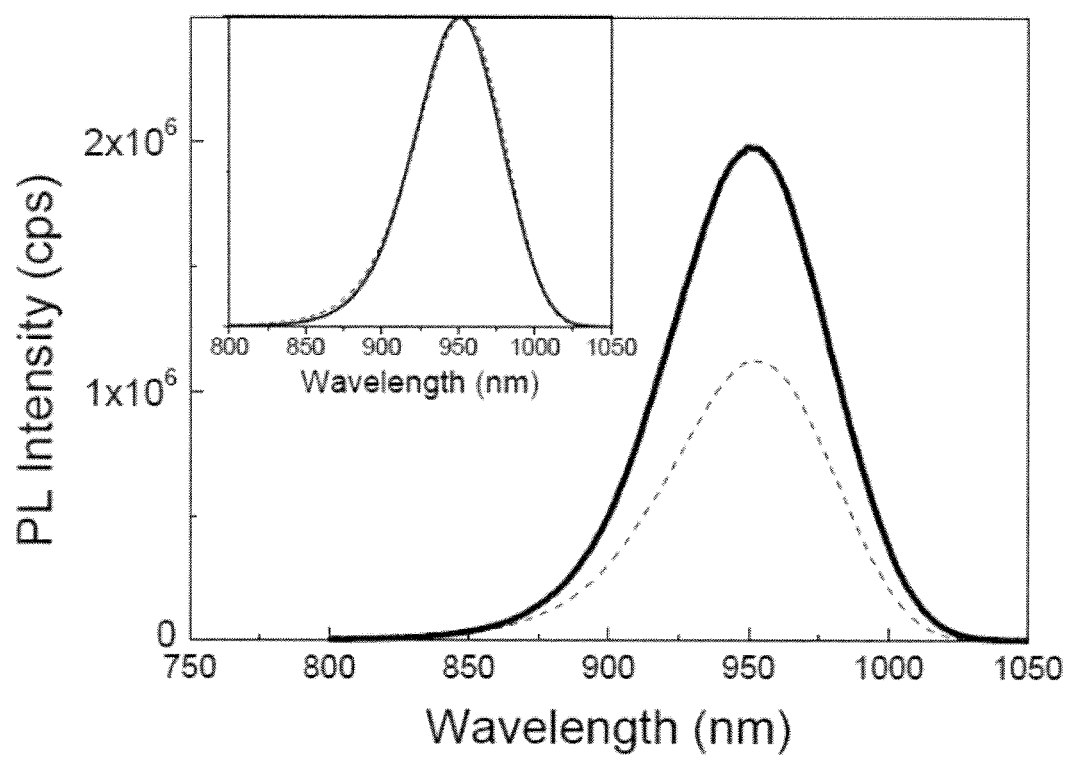
FIG. 6 shows photoluminescence (PL) spectra of CsSnI$_3$ thin films. The dashed line was taken from CsSnI$_3$ thin film formed from the solution-based spray-coating synthesis; the solid curve was taken from CsSnI$_3$ thin film formed from the vacuum-powder-based synthesis. The inset displays the normalized photoluminescence (PL) spectra. The inset indicates that the spectra are the same for CsSnI$_3$ from solution-based and vacuum-powder-based synthesis.

As shown in FIG. 6, the PL intensity of a typical solution-based spray-coated CsSnI$_3$ film on a glass substrate was about little more than half of the PL intensity taken from a typical thin-film synthesized from thermal evaporator powders by the vacuum-powder based method (as disclosed in U.S. patent application Ser. No. 13/151,243) under the identical excitation and PL collection conditions.

The PL line shape was identical for the solution-based spray-coated and vacuum-powder based deposition or synthesis methods as displayed in the inset of FIG. 6. This result strongly suggested that the film quality of those CsSnI$_3$ thin films was compatible using two different synthesis methods.

XRD data were used not only to further verify the crystal structure of CsSnI$_3$ but importantly also to identify the side products when the CsI solution was formed as the end products and mixed with the SnCl$_2$ solution (as shown in the reaction).

Figure 7:
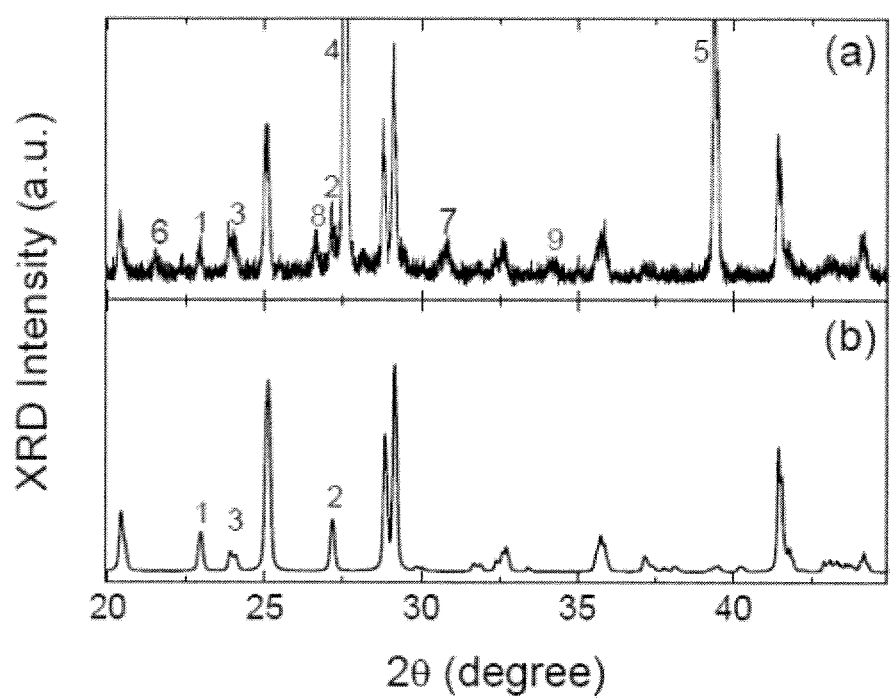
FIG. 7 shows (a) X-ray diffraction data (XRD) profile taken from a solution-based spray-coated CsSnI$_3$ thin film; and (b) theoretical calculated XRD profile using orthorhombic crystal structure of CsSnI$_3$.

FIG. 7(a) showed the XRD data measured from the solution-based spray-coating CsSnI$_3$ film.

FIG. 7(b) showed theoretical calculated XRD profile by using a commercial software package CASTEP written by researchers at the Universities of York, Durham, St. Andrews, Cambridge and Rutherford Labs, using orthorhombic crystal structure of CsSnI$_3$. CASTEP uses density functional theory with a plane wave basis set to calculate the electronic properties of crystalline solids and other materials from first principles.

All the measured peaks were accounted for and sorted into four groups.

The first group consisted of the peaks of 1 to 3 and all others not number-labeled. These peaks were originated from the orthorhombic structure of CsSnI$_3$ and match the calculated XRD profile, as taught by CASTEP, as shown in FIG. 7(b).

Peaks 1 and 2 reflected the expected XRD features of the Sn—I—Sn bond tilting) (163° in the a- and b-direction, respectively, in reference to the cubic-structure of CsSnI$_3$.

Peak 3 represented the signature of the Sn—I—Sn bond tilting (170°) in the c-direction in reference to the tetragonal structure of CsSnI$_3$.

The second group included the peaks of 4 and 5. Those peaks were originated from the residual material CsI.

The peaks of 6 and 7 made up the third group. The peaks of 6 and 7 were originated from CsCl, leading to the unambiguous determination of the chemical reaction as the CsI solution was transferred into the SnCl$_2$ solution to form CsCl.

Finally, the presence of peaks 8 and 9 made up the fourth group. The peaks 8 and 9 matched Sn (IV) dioxide, SnO$_2$. It should be mentioned here that the absence of XRD peaks associated with the residual SnCl$_2$ strongly suggested that the chemical reaction under the ambient conditions resulting in favor of CsSnI$_3$ formation.

In summary, CsSnI$_3$ thin films were synthesized using ultra spray-coating the CsI and SnCl$_2$ solutions alternately on a substrate followed by a heat treatment.

The solution-based spray-coating method, capable of large-scale production, can be employed to fabricate CsSnI$_3$ thin films at a low cost, especially suitable for solar cell applications. The film polycrystalline quality was characterized by SEM, PL, and XRD data. Those data was verified to be comparable to that of similar thin-films synthesized by the vacuum-powder-based evaporation method.

While the invention has been described in detail and with reference to specific examples and the embodiments thereof, it will be apparent to one skilled in the art that various changes and modifications can be made therein without departing from the spirit and scope thereof.

The invention claimed is:

1. A process of forming CsSnI$_3$ film on a substrate, comprising steps of:
   (a) providing a substrate;
   (b) provide CsI solution;
   (c) provide SnCl$_2$ solution;
   (d) spray-coating the CsI solution onto the substrate;
   (e) spray-coating the SnCl$_2$ solution onto the substrate;
   (f) heat treating the substrate after steps (d) and (e); and
   (g) forming the CsSnI$_3$ film on the substrate;

wherein each of the spray-coating steps (d) and (e) independently has a spray speed from about 0.03 to about 0.8 mL/min.

2. The process of claim 1, wherein temperature in heat treating step (f) ranges from about 150° C. to about 250° C.

3. The process of claim 1, wherein the substrate is selected from glass, ceramic, silicon, and metal foils.

4. The process of claim 1, wherein
the CsI solution in (b) contains about 5 wt % to about 50 wt % CsI by fully dissolving CsI powder (99.9% purity) in a solvent; and
the $SnCl_2$ solution in (c) contains about 5 wt % to about 80 wt % $SnCl_2$ by fully dissolving $SnCl_2$ powder (99.9% purity) in a solvent.

5. The process of claim 4, wherein
the solvent for dissolving CsI powder (99.9% purity) is selected from the group consisting of water, deionized water, distilled water and mixtures thereof; and
the solvent for dissolving $SnCl_2$ powder (99.9% purity) is selected from the group consisting of anhydrous alcohol, glacial acetic acid; ethylene glycol or triethylene glycol; and mixtures thereof.

6. The process of claim 4, wherein
the solvent for dissolving CsI powder (99.9% purity) is selected from the group consisting of water, deionized water, distilled water and mixtures thereof; and the CsI solution contains 15 wt % to 40 wt % CsI; and
the solvent for dissolving $SnCl_2$ powder (99.9% purity) is selected from the group consisting of anhydrous ethanol, anhydrous methanol, anhydrous isopropyl and mixtures thereof; and the $SnCl_2$ solution contains 20 wt % to 50 wt % $SnCl_2$.

7. The process of claim 4, wherein
temperature in heat treating step (f) ranges from about 150° C. to about 250° C.;
the substrate is selected from glass, ceramic, silicon, and metal foils;
the solvent for dissolving CsI powder (99.9% purity) is selected from the group consisting of deionized water, distilled water and mixtures thereof; and
the solvent for dissolving $SnCl_2$ powder (99.9% purity) is anhydrous ethanol.

8. The process of claim 7, wherein steps (d) and (e) are repeated to get a desired film thickness.

9. A process of forming $CsSnI_3$ film on a substrate, comprising steps of:
(a) providing a substrate;
(b) provide about 5 wt % to about 50 wt % CsI solution by fully dissolving CsI powder (99.9% purity) in a solvent;
(c) provide about 5 wt % to about 80 wt % $SnCl_2$ solution by fully dissolving $SnCl_2$ powder (99.9% purity) in a solvent;
(d) spray-coating the CsI solution onto the substrate;
(e) spray-coating the $SnCl_2$ solution onto the substrate;
(f) repeating steps (d) and (e);
(g) heat treating the substrate after steps (d) to (f); and
(h) forming the $CsSnI_3$ film on the substrate;
wherein each of the spray-coating steps (d) and (e) independently has a spray speed from about 0.03 to about 0.8 mL/min.

10. The process of claim 9, wherein the process steps (a) to (f) are performed under ambient condition; temperature in the heat treating step (g) ranges from about 150° C. to about 250° C.; and the substrate is selected from glass, ceramic, silicon, and metal foils.

11. The process of claim 9, wherein the solvent for dissolving CsI powder (99.9% purity) is selected from the group consisting of water, deionized water, distilled water and mixtures thereof; and
the solvent for dissolving $SnCl_2$ powder (99.9% purity) is selected from the group consisting of anhydrous alcohol, glacial acetic acid; ethylene glycol or triethylene glycol;
and mixtures thereof.

12. The process of claim 9, wherein the solvent for dissolving CsI powder (99.9% purity) is selected from the group consisting of water, deionized water, distilled water and mixtures thereof; and the CsI solution contains about 15 wt % to about 40 wt % CsI; and
the solvent for dissolving $SnCl_2$ powder (99.9% purity) is selected from the group consisting of anhydrous ethanol, anhydrous methanol, anhydrous isopropyl and mixtures thereof; and the $SnCl_2$ solution contains about 20 wt % to about 50 wt % $SnCl_2$.

13. The process of claim 12, wherein
the steps (a) to (f) are performed under ambient condition;
a temperature in the heat treating step (g) ranges from about 150° C. to about 250° C.;
the substrate is selected from glass, ceramic, silicon, and metal foils;
the solvent for dissolving CsI powder (99.9% purity) is selected from the group consisting of deionized water, distilled water and mixtures thereof; and
the solvent for dissolving $SnCl_2$ powder (99.9% purity) is anhydrous ethanol.

* * * * *